(12) United States Patent
Kumagae et al.

(10) Patent No.: US 10,153,092 B2
(45) Date of Patent: Dec. 11, 2018

(54) THIN-FILM CAPACITOR

(71) Applicant: TDK CORPORATION, Tokyo (JP)

(72) Inventors: Michihiro Kumagae, Tokyo (JP);
Akifumi Kamijima, Tokyo (JP);
Norihiko Matsuzaka, Tokyo (JP);
Junki Nakamoto, Tokyo (JP);
Kazuhiro Yoshikawa, Tokyo (JP);
Kenichi Yoshida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/725,860

(22) Filed: Oct. 5, 2017

(65) Prior Publication Data
US 2018/0102219 A1  Apr. 12, 2018

(30) Foreign Application Priority Data

Oct. 11, 2016 (JP) .................................. 2016-199915

(51) Int. Cl.
*H01G 4/33* (2006.01)
*H01G 4/018* (2006.01)
(Continued)

(52) U.S. Cl.
CPC ............. *H01G 4/306* (2013.01); *H01G 4/012* (2013.01); *H01G 4/224* (2013.01); *H01G 4/33* (2013.01);
(Continued)

(58) Field of Classification Search
CPC ............. H01G 4/306; H01G 4/30; H01G 4/33
(Continued)

(56) References Cited

U.S. PATENT DOCUMENTS

| 4,842,893 A | 6/1989 | Yializis et al. |
| 5,018,048 A | 5/1991 | Shaw et al. |
(Continued)

FOREIGN PATENT DOCUMENTS

| JP | S55-091112 A | 7/1980 |
| JP | S63-072108 A | 4/1988 |
(Continued)

OTHER PUBLICATIONS

U.S. Appl. No. 15/725,654, filed Oct. 5, 2017 in the name of Yoshida et al.
(Continued)

*Primary Examiner* — Eric W Thomas
(74) *Attorney, Agent, or Firm* — Oliff PLC

(57) ABSTRACT

A thin-film capacitor including a stacked body having a lower electrode layer, a plurality of dielectric layers stacked on the lower electrode layer, one or more internal electrode layers interposed between the dielectric layers, and an upper electrode layer that is stacked on the opposite side of the lower electrode layer with the dielectric layers and the internal electrode layers interposed between, and a cover layer that covers the stacked body. The stacked body includes opening portions that have the lower electrode layer, opens upward in a stacking direction, and has a side surface formed to include an inclined surface. The cover layer is stacked on the inclined surface of the stacked body. A curved surface with a predetermined shape is formed on the inclined surface for each pair of layers including the dielectric layer forming the inclined surface and the electrode layer, forming the inclined surface.

6 Claims, 4 Drawing Sheets

(51) Int. Cl.
*H01G 4/005* (2006.01)
*H01G 4/30* (2006.01)
*H01G 4/012* (2006.01)
*H01G 4/224* (2006.01)
*H01G 4/008* (2006.01)
*H01G 4/12* (2006.01)

(52) U.S. Cl.
CPC ........... *H01G 4/008* (2013.01); *H01G 4/1218* (2013.01); *H01G 4/1227* (2013.01); *H01G 4/1245* (2013.01); *H01G 4/1254* (2013.01)

(58) Field of Classification Search
USPC .................................... 361/301.4; 257/303
See application file for complete search history.

(56) References Cited

U.S. PATENT DOCUMENTS

| | | | |
|---|---|---|---|
| 5,032,461 A | 7/1991 | Shaw et al. | |
| 5,097,800 A | 3/1992 | Shaw et al. | |
| 5,125,138 A | 6/1992 | Shaw et al. | |
| 5,745,335 A | 4/1998 | Watt | |
| 6,034,864 A | 3/2000 | Naito et al. | |
| 6,134,098 A | 10/2000 | Kuroda et al. | |
| 6,370,011 B1 | 4/2002 | Naito et al. | |
| 6,411,494 B1 | 6/2002 | Watt | |
| 6,462,932 B1 | 10/2002 | Naito et al. | |
| 6,549,395 B1 | 4/2003 | Naito et al. | |
| 6,724,611 B1 | 4/2004 | Mosley | |
| 8,343,361 B2 | 1/2013 | Takeshima et al. | |
| 2002/0109958 A1 | 8/2002 | Naito et al. | |
| 2004/0099999 A1 | 5/2004 | Borland | |
| 2004/0108134 A1 | 6/2004 | Borland et al. | |
| 2004/0125539 A1 | 7/2004 | Murakami et al. | |
| 2004/0201367 A1 | 10/2004 | Echigo et al. | |
| 2004/0231885 A1 | 11/2004 | Borland et al. | |
| 2004/0233611 A1 | 11/2004 | Borland | |
| 2005/0063135 A1 | 3/2005 | Borland et al. | |
| 2005/0121772 A1 | 6/2005 | Hayashi et al. | |
| 2005/0195554 A1 | 9/2005 | Borland et al. | |
| 2005/0269287 A1 | 12/2005 | Tsujimura et al. | |
| 2005/0287755 A1 | 12/2005 | Bachmann et al. | |
| 2006/0196599 A1 | 9/2006 | Satou | |
| 2008/0145996 A1* | 6/2008 | Nomura | H01G 4/33 438/396 |
| 2009/0017591 A1 | 1/2009 | Cervin-Lawry et al. | |
| 2009/0283819 A1 | 11/2009 | Ishikawa et al. | |
| 2010/0044831 A1 | 2/2010 | Guegan | |
| 2010/0252527 A1 | 10/2010 | Takeshima et al. | |
| 2012/0262836 A1 | 10/2012 | Chai | |
| 2013/0048596 A1 | 2/2013 | Komuro et al. | |
| 2013/0258796 A1 | 10/2013 | Hioka et al. | |
| 2015/0093497 A1 | 4/2015 | Koutsaroff et al. | |
| 2015/0334822 A1 | 11/2015 | Shinkawa et al. | |
| 2015/0357401 A1 | 12/2015 | Pelloquin et al. | |
| 2017/0345576 A1 | 11/2017 | Tsuyoshi et al. | |

FOREIGN PATENT DOCUMENTS

| | | |
|---|---|---|
| JP | S63-310156 A | 12/1988 |
| JP | H1-120858 A | 5/1989 |
| JP | H1-278061 A | 11/1989 |
| JP | H03-034580 A | 2/1991 |
| JP | H4-111462 A | 4/1992 |
| JP | H8-078283 A | 3/1996 |
| JP | 2000-514243 A | 10/2000 |
| JP | 2006-510233 A | 3/2006 |
| JP | 2014090077 A | 5/2014 |
| WO | 98/000871 A1 | 1/1998 |
| WO | 2009/078225 A1 | 6/2009 |

OTHER PUBLICATIONS

U.S. Appl. No. 15/725,571, filed Oct. 5, 2017 in the name of Takasaki et al.

Oct. 19, 2018 Office Action issued in U.S. Appl. No. 15/725,654.

* cited by examiner

THIN-FILM CAPACITOR

TECHNICAL FIELD

The present invention relates to a thin-film capacitor.

BACKGROUND

A multilayer thin-film capacitor in which a dielectric layer and an electrode layer are alternately stacked on a lower electrode layer and an upper electrode layer is formed thereon is known. In such a thin-film capacitor, an insulating cover layer that covers side surfaces of the dielectric layers and the electrode layers is generally formed to protect the dielectric layers and the electrode layers (for example, see Japanese Unexamined Patent Publication No. 2000-514243).

SUMMARY

However, in the thin-film capacitor, there is a likelihood that breakage or the like will occur due to separation of the cover layer from a stacked body in which the dielectric layers and the electrode layers are stacked.

The invention is made in consideration of the above-mentioned circumstances and an object thereof is to provide a thin-film capacitor that can prevent separation of a cover layer from a stacked body.

In order to achieve the above-mentioned object, according to an aspect of the invention, there is provided a thin-film capacitor including a stacked body including a lower electrode layer, one or more dielectric layers that are stacked on the lower electrode layer in a stacking direction, and one or more internal electrode layers that are stacked on any one of the one or more dielectric layers in the stacking direction, wherein the stacked body includes an opening portion that has the lower electrode layer or one electrode layer selected from the one or more internal electrode layers as a bottom surface, opens upward in the stacking direction of the electrode layer of the bottom surface, and has a side surface which is formed to include an inclined surface formed by the dielectric layer and the electrode layer above the electrode layer of the bottom surface, the inclined surface of the opening portion in the stacked body is covered with a cover layer, and a curved surface with a predetermined shape is formed on the inclined surface for each pair layer, each pair layer including the dielectric layer forming the inclined surface and the electrode layer, which is stacked on the dielectric layer, forming the inclined surface.

According to the thin-film capacitor, a curved surface with a predetermined shape is formed on the inclined surface of the opening portion of the stacked body for each pair layer including a dielectric layer and an electrode layer stacked thereon. Accordingly, adhesiveness of the cover layer to the stacked body of the electrode layers and the dielectric layers is improved on the inclined surface of the opening portion. Accordingly, in the thin-film capacitor, it is possible to prevent separation of the cover layer from the stacked body.

Here, the predetermined shape may be a concave shape or a convex shape.

When the shape of the inclined surface is set to a concave shape or a convex shape as described above, it is possible to more easily form the shape.

The curved surface with the predetermined shape may be formed over the overall inclined surface which is formed by the pair layers.

Since the curved surface with the predetermined shape is formed over the overall inclined surface formed by the pair layers as described above, it is possible to further improve adhesiveness to the cover layer and to effectively prevent separation of the cover layer from the stacked body.

According to the invention, it is possible to provide a thin-film capacitor that can prevent separation of a cover layer from a stacked body.

DETAILED DESCRIPTION

Hereinafter, an embodiment of the invention will be described in detail with reference to the accompanying drawings. In description with reference to the drawings, the same elements will be referenced by the same reference signs and description thereof will not be repeated.

Figure 1:
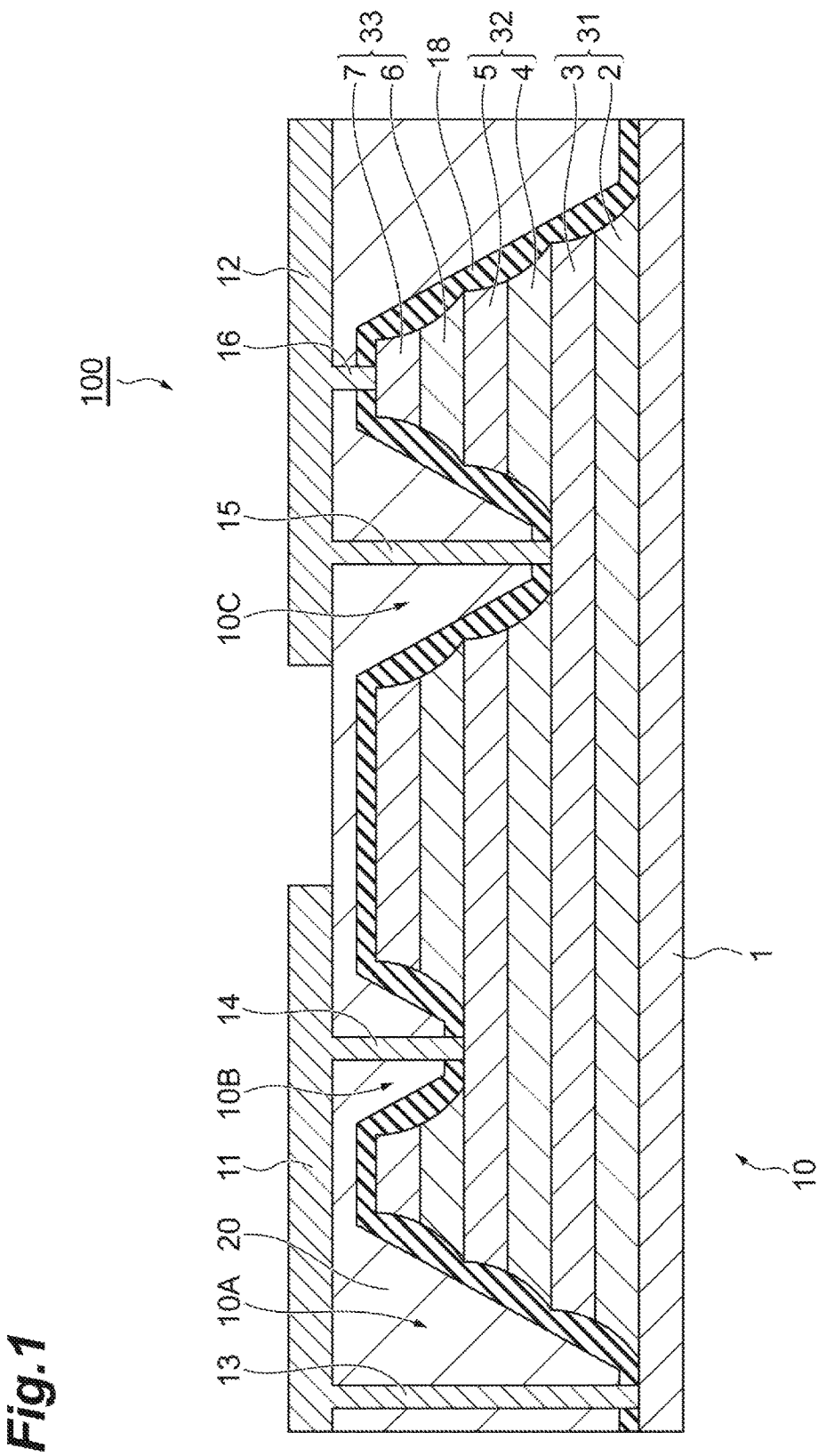
FIG. 1 is a schematic cross-sectional view of a thin-film capacitor according to an embodiment of the invention.

FIG. 1 is a schematic cross-sectional view of a thin-film capacitor according to an embodiment of the invention. As illustrated in FIG. 1, a thin-film capacitor 100 according to this embodiment includes a lower electrode layer 1, three dielectric layers 2, 4, and 6 that are stacked on the lower electrode layer 1, an internal electrode layer 3 that is stacked between the dielectric layer 2 and the dielectric layer 4, an internal electrode layer 5 that is stacked between the dielectric layer 4 and the dielectric layer 6, and an upper electrode layer 7 that is stacked on the opposite side of the lower electrode layer 1 with the dielectric layers 2, 4, and 6 and the internal electrode layers 3 and 5 interposed therebetween. The lower electrode layer 1 and the dielectric layer 2, the internal electrode layer 3, the dielectric layer 4, the internal electrode layer 5, the dielectric layer 6, and the upper electrode layer 7 which are sequentially stacked on the lower electrode layer 1 are together referred to as a stacked body 10. In the following description, a direction in which the dielectric layers and the internal electrode layers are sequentially superimposed from the lower electrode layer 1 to the upper electrode layer 7 like the lower electrode layer 1, the dielectric layer 2, and the internal electrode layer 3 is defined as a "stacking direction." An upper side (upward) in the stacking direction refers to the upper electrode layer 7 side, and a lower side (downward) in the stacking direction refers to the lower electrode layer 1 side.

The thin-film capacitor 100 includes a pair of terminal electrodes 11 and 12 on the opposite side of the lower electrode layer 1 with the dielectric layers 2, 4, and 6, the internal electrode layers 3 and 5, and the upper electrode layer 7 interposed therebetween. The terminal electrode 11 is electrically connected to the lower electrode layer 1 via a via-plug 13 and is electrically connected to the internal electrode layer 5 via a via-plug 14. The terminal electrode 12 is electrically connected to the internal electrode layer 3 via a via-plug 15 and is electrically connected to the upper electrode layer 7 via a via-plug 16. The pair of terminal electrodes 11 and 12 are electrically isolated from each other.

The thin-film capacitor 100 includes a cover layer 18 that covers a side surface and a top surface of the stacked body including the lower electrode layer 1, the dielectric layers 2, 4, and 6, the internal electrode layers 3 and 5, and the upper electrode layer 7. The cover layer 18 has only to cover at least the side surface of the stacked body, and may expose the top surface of the stacked body. The thin-film capacitor 100 includes a protective layer 20 that covers a space between the terminal electrodes 11 and 12 and the cover layer 18. Hereinafter, elements constituting the thin-film capacitor 100 will be described.

The lower electrode layer 1 is formed of a conductive material. Specifically, an alloy including nickel (Ni) or platinum (Pt) as a main component can be preferably used as the conductive material of the lower electrode layer 1, and particularly an alloy including Ni as a main component can be suitably used. The purity of Ni in the lower electrode layer 1 is preferably as high as possible and is more preferably equal to or greater than 99.99 wt %. Traces of impurities may be included in the lower electrode layer 1. Examples of the impurities which can be included in the lower electrode layer 1 formed of an alloy including Ni as a main component include a transition metal element or rare earth element such as iron (Fe), titanium (Ti), copper (Cu), aluminum (Al), magnesium (Mg), manganese (Mn), silicon (Si), chromium (Cr), vanadium (V), zinc (Zn), niobium (Nb), tantalum (Ta), yttrium (Y), lanthanum (La), or cesium (Ce), or chlorine (Cl), sulfur (S), or phosphorus (P).

The thickness of the lower electrode layer 1 preferably ranges from 10 nm to 100 μmm more preferably ranges from 1 μm to 70 μm, and still more preferably ranges from 10 μm to 30 μm. When the thickness of the lower electrode layer 1 is excessively small, there is a tendency for the lower electrode layer 1 to be difficult to handle at the time of manufacturing the thin-film capacitor 100. When the thickness of the lower electrode layer 1 is excessively large, there is a tendency for an effect of suppressing a leak current to be reduced. The area of the lower electrode layer 1 is, for example, about 1×0.5 mm². The lower electrode layer 1 is preferably formed of a metal foil and is used together as a substrate and an electrode. In this way, it is preferable that the lower electrode layer 1 in this embodiment be configured to be also used as a substrate, but a substrate/electrode film structure in which the lower electrode layer 1 is formed on a substrate formed of Si, alumina, or the like may be employed.

The dielectric layers 2, 4, and 6 are formed of a (ferroelectric) dielectric material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, or $Pb(Zr_xTi_{1-x})O_3$, a complex perovskite relaxer type ferroelectric material such as $Pb(Mg_{1/3}Nb_{2/3})O_3$, a bismuth-layered compound such as $Bi_4Ti_3O_{12}$ or $SrBi_2Ta_2O_9$, a tungsten-bronze type ferroelectric material such as $(Sr_{1-x}Ba_x)Nb_2O_6$ or $PbNb_2O_6$, or the like. Here, in the perovskite structure, the complex perovskite relaxer type ferroelectric material, the bismuth-layered compound, and the tungsten-bronze type ferroelectric material, a ratio of A site and B site is normally an integer ratio, but may be intentionally deviated from the integer ratio for the purpose of improvement in characteristics. In order to control characteristics of the dielectric layers 2, 4, and 6, additives may be appropriately added as a secondary component to the dielectric layers 2, 4, and 6.

The thicknesses of the dielectric layers 2, 4, and 6 range, for example, from 10 nm to 1000 nm. The areas of the dielectric layers 2, 4, and 6 are, for example, about 0.9×0.5 mm².

The internal electrode layers 3 and 5 interposed between the dielectric layers 2, 4, and 6 are formed of a conductive material. Specifically, a material including nickel (Ni) or platinum (Pt) as a main component can be preferably used as the conductive material of the internal electrode layer 3 and 5, and particularly a material including Ni as a main component can be suitably used. When a material including Ni as a main component is used for the internal electrode layers 3 and 5, the content thereof is preferably equal to or greater than 50 mol % with respect to the whole internal electrode layers 3 and 5. When a main component of the internal electrode layers 3 and 5 is Ni, at least a kind (hereinafter referred to as an "additive element") selected from a group consisting of platinum (Pt), palladium (Pd), iridium (Ir), rhodium (Rh), ruthenium (Ru), osmium (Os), rhenium (Re), tungsten (W), chromium (Cr), tantalum (Ta), and silver (Ag) is additionally added. Since the internal electrode layers 3 and 5 include an additive element, breakage of the internal electrode layers 3 and 5 is prevented. The internal electrode layers 3 and 5 may include a plurality of kinds of additive elements.

The thicknesses of the internal electrode layers 3 and 5 range, for example, from 10 nm to 1000 nm. The areas of the internal electrode layers 3 and 5 are, for example, about 0.9×0.4 mm².

The upper electrode layer 7 is preferably formed of an alloy including Ni as a main component. Traces of impurities may be included in the upper electrode layer 7. Examples of the impurities which can be included in the upper electrode layer 7 include a transition metal element or rare earth element such as iron (Fe), titanium (Ti), copper (Cu), aluminum (Al), magnesium (Mg), manganese (Mn), silicon (Si), chromium (Cr), vanadium (V), zinc (Zn), niobium (Nb), tantalum (Ta), yttrium (Y), lanthanum (La), or cesium (Ce), or chlorine (Cl), sulfur (S), or phosphorus (P). In addition to an alloy including Ni as a main component, platinum (Pt), lead (Pd), iridium (Ir), rhodium (Rh), ruthenium (Ru), osmium (Os), rhenium (Re), titanium (Ti), manganese (Mn), and silver (Ag) other than aluminum (Al), copper (Cu), tungsten (W), chromium (Cr), tantalum (Ta), and niobium (Nb) which are used for wires of a Si semiconductor, a display panel, or the like may be used as the upper electrode layer 7.

The dielectric layers 2, 4, and 6 are disconnected in the cross section of the thin-film capacitor 100 illustrated in FIG. 1, but are continuous in a cross section perpendicular to the stacking direction. Similarly, the internal electrode layers 3 and 5 and the upper electrode layer 7 are continuous in a cross section perpendicular to the stacking direction.

The terminal electrodes 11 and 12 are formed of a conductive material such as copper (Cu). The via-plugs 13, 14, 15, and 16 connected to the terminal electrodes 11 and 12 are formed of a conductive material such as copper (Cu).

The cover layer 18 can be formed of the same material as the dielectric layers 2, 4, and 6. That is, a (ferroelectric) dielectric material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, or $Pb(Zr_xTi_{1-x})O_3$, a complex perovskite relaxer type ferroelectric material such as $Pb(Mg_{1/3}Nb_{2/3})O_3$, a bismuth-layered compound such as $Bi_4Ti_3O_{12}$ or $SrBi_2Ta_2O_9$, a tungsten-bronze type ferroelectric material such as $(Sr_{1-x}Ba_x)Nb_2O_6$ or $PbNb_2O_6$, or the like can be suitably used for the cover layer 18. By forming the cover layer 18 out of the same material as the dielectric layers 2, 4, and 6, it is possible to prevent stress from being generated between the cover layer 18 and other layers (particularly, the dielectric layers 2, 4, and 6 and the like) in contact with the cover layer 18. Accordingly, it is possible to prevent separation of the cover layer 18 from the other layers and thus it is possible to achieve an effect of an increase in electrostatic capacitance or suppression of a leak current. The material of the cover layer 18 is not limited to the above-described materials, and an inorganic material such as $SiO_2$, alumina, or SiN (silicon nitride), an organic material such as polyimide, or an insulating material in which they are mixed or stacked may be used.

The insulating protective layer 20 disposed between the terminal electrodes 11 and 12 and the cover layer 18 is formed of, for example, polyimide. By covering the cover layer 18 with the protective layer 20, it is possible to suppress a leak current between the cover layer 18 and the terminal electrodes 11 and 12. It is preferable that the protective layer 20 be disposed between the terminal electrodes 11 and 12 and the cover layer 18 in view of a leak current, but the protective layer 20 may not be disposed.

In the thin-film capacitor 100, an opening portion 10A is formed in the stacked body 10 around the via-plug 13 connecting the terminal electrode 11 to the lower electrode layer 1. The bottom surface of the opening portion 10A exposes the lower electrode layer 1 which is electrically connected to the via-plug 13. The opening portion 10A has the lower electrode layer 1 as the bottom surface and opens upward in the stacking direction (toward the upper electrode layer 7). On the side surface of the opening portion 10A, the dielectric layer 2, the internal electrode layer 3, the dielectric layer 4, the internal electrode layer 5, the dielectric layer 6, and the upper electrode layer 7 in the stacking direction above the lower electrode layer 1 which is electrically connected to the via-plug 13 in the stacked body 10 constitute an inclined surface.

An opening portion 10B is formed in the stacked body 10 around the via-plug 14 connecting the terminal electrode 11 to the internal electrode layer 5. The bottom surface of the opening portion 10B exposes the internal electrode layer 5 which is electrically connected to the via-plug 14. The opening portion 10B has the internal electrode layer 5 as the bottom surface and opens upward in the stacking direction (toward the upper electrode layer 7). On the side surface of the opening portion 10B, the dielectric layer 6 and the upper electrode layer 7 in the stacking direction above the internal electrode layer 5 which is electrically connected to the via-plug 14 in the stacked body 10 constitute an inclined surface.

Similarly, an opening portion 10C is formed in the stacked body 10 around the via-plug 15 connecting the terminal electrode 12 to the internal electrode layer 3. The bottom surface of the opening portion 10C exposes the internal electrode layer 3 which is electrically connected to the via-plug 15. The opening portion 10C has the internal electrode layer 3 as the bottom surface and opens upward in the stacking direction (toward the upper electrode layer 7). On the side surface of the opening portion 10C, the dielectric layer 4, the internal electrode layer 5, the dielectric layer 6, and the upper electrode layer 7 in the stacking direction above the internal electrode layer 3 which is electrically connected to the via-plug 15 in the stacked body 10 constitute an inclined surface.

As described above, the bottom surfaces of the opening portions 10A to 10C are formed by the lower electrode layer 1 or one electrode layer selected from the internal electrode layers 3 and 5. The inclined surfaces are formed by the dielectric layers and the electrode layers (the internal electrode layers and the upper electrode layer) above the bottom surface.

Figure 2A:
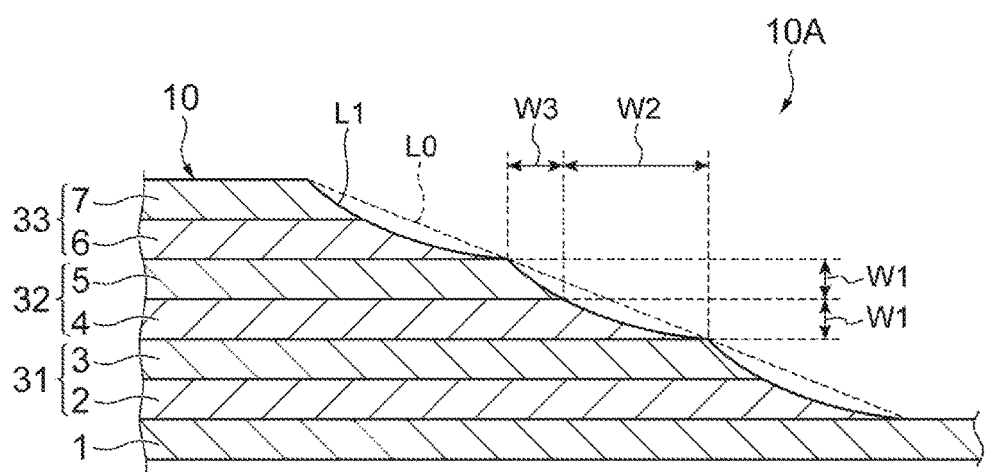
FIGS. 2A and 2B are diagrams illustrating an inclined surface of the thin-film capacitor.
Figure 2B:
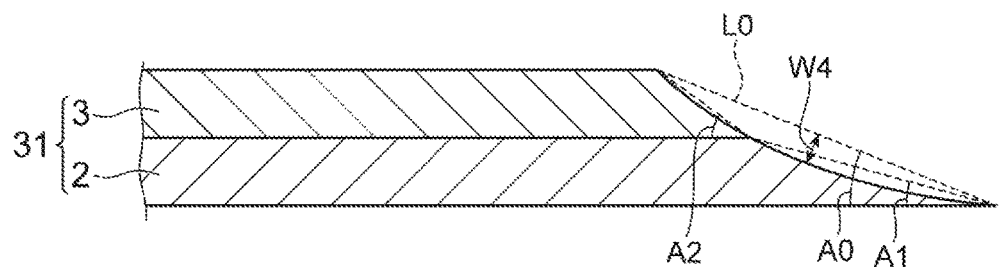

The opening portion 10A will be described in more detail with reference to FIGS. 2A and 2B. FIG. 2A is a diagram schematically illustrating the stacked body 10 in the opening portion 10A. FIG. 2B is an enlarged view of the dielectric layer 2 and the internal electrode layer 3 of the stacked body 10 in the opening portion 10A.

As illustrated in FIG. 2A, on the side surface of the opening portion 10A, the inclined surface is formed by the dielectric layer 2, the internal electrode layer 3, the dielectric layer 4, the internal electrode layer 5, the dielectric layer 6, and the upper electrode layer 7. The inclined surface is formed such that a curved surface with a predetermined pattern is repeated. More specifically, a curved surface with a predetermined pattern is formed for each pair layer including one dielectric layer and one electrode layer (one internal electrode layer or the upper electrode layer) stacked thereon. In the opening portion 10A, a pair layer 31 is formed by the dielectric layer 2 and the internal electrode layer 3 stacked thereon. A pair layer 32 is formed by the dielectric layer 4 and the internal electrode layer 5 stacked thereon. A pair layer 33 is formed by the dielectric layer 6 and the upper electrode layer 7 stacked thereon.

In each of the pair layers 31, 32, and 33, the inclined surface of the opening portion 10A exhibits a concave curved surface as illustrated in FIGS. 2A and 2B. The concave curved surface refers to a curved surface which is concave when the inclined surface is viewed in the stacking direction. FIGS. 2A and 2B illustrate only the inclined surface of one side of the opening portion 10A, but a concave curved surface is exhibited for each pair layer on the inclined surfaces forming the opening portion 10B and the opening portion 10C as illustrated in FIG. 1.

In the thin-film capacitor 100 according to this embodiment, since the concave curved surfaces are formed on the inclined surfaces of the opening portions 10A, 10B, and 10C for each pair layer, adhesiveness to the cover layer 18 covering the inclined surfaces is improved by an anchor effect of the inclined surfaces. As a result, it is possible to achieve an effect of preventing separation of the stacked body 10 having the inclined surfaces from the cover layer 18.

The inclined surface of the opening portion 10A will be described below in more detail. As illustrated in FIG. 2A, it is assumed that thicknesses (lengths in the stacking direction) of the dielectric layers 2, 4, and 6, the internal electrode layers 3 and 5, and the upper electrode layer 7 are all defined as W1, widths (the lengths in a direction parallel to a plane perpendicular to the stacking direction) of the dielectric layers 2, 4, and 6 are all defined as W2, and widths of the internal electrode layers 3 and 5 and the upper electrode layer 7 are all defined as W3. In this case, when the inclined surface has a concave shape, a relationship of W2>W3 is satisfied as illustrated in FIG. 2A. As illustrated in FIG. 2A, the length L1 of the concave inclined surface is larger than the length of a reference line L0, where a line connecting ends in the stacking direction of the pair layers 31, 32, and 33 is defined as the reference line L0. The reference line L0 also corresponds to a line connecting ends of the inclined surface.

In a case in which the concave inclined surface is formed for each of the pair layers 31, 32, and 33, when an angle of the inclined surface of the lower dielectric layer 2 of the pair layer 31 (an angle formed by a straight line connecting an upper end and a lower end and the horizontal plane) is defined as an inclination angle A1 and an angle of the inclined surface of the upper internal electrode layer 3 is defined as an inclination angle A2 as illustrated in FIG. 2B, a relationship of A1<A2 is satisfied. When an angle formed by the reference line L0 of the inclined surface and the horizontal plane is defined as an inclination angle A0, a relationship of A1<A0<A2 is satisfied. It is preferable that the inclination angle A0 range from 10° to 45°. When the inclination angle A0 is less than 10°, the inclined surface has a slower inclination and thus the opening portion increases in size. Since the increase in size of the opening portion causes a decrease in capacity, the size of the thin-film capacitor 100 is increased to secure a desired capacity. On the other hand, when the inclination angle A0 is greater than 45°, the inclined surface has an acute angle and thus the size of the opening portion can decrease. On the other hand, since the ends of the neighboring electrode layers with one dielectric layer interposed therebetween get close to each other, a likelihood that the electrode layers will short-circuit at the time of processing or the like increases. Accordingly, by setting the inclination angle A0 to the above-mentioned range, it is possible to prevent the electrode layers from short-circuiting while preventing an increase in size of the opening portion.

As illustrated in FIG. 2B, a maximum distance (a depth of the inclined surface) W4 of the surface of the concave inclined surface from the reference line L0 preferably ranges from 10 nm to 500 nm. By setting the maximum distance W4 of the surface of the inclined surface from the reference line L0 to be equal to or greater than 10 nm, an anchor effect due to the curved inclined surface can be suitably achieved. On the other hand, when the maximum distance W4 is set to be greater than 500 nm, the dielectric layer is greatly cut out as illustrated in FIG. 2B. Since there is a likelihood that the cutting-out of the dielectric layer will cause a decrease in capacity of the thin-film capacitor 100, the size of the thin-film capacitor 100 needs to be increased to secure the capacity. Since the distance between the neighboring electrode layers with the dielectric layer interposed therebetween decreases, there is a likelihood that short-circuiting will occur. That is, by setting the maximum distance W4 to be equal to or less than 500 nm, it is possible to secure a desired capacity and to prevent the electrode layers from short-circuiting.

When the inclined surface of the opening portion 10A is formed by a plurality of pair layers 31, 32, and 33, the inclination angle of each pair layer (the reference line) and the inclination angles of the constituent layers (the dielectric layer and the electrode layer) of the pair layer may be identical for each pair layer or may differ depending on the pair layers, as illustrated in FIG. 2A. The inclined surfaces of only some pair layers of the plurality of pair layers may have have a curved surface. In the thin-film capacitor 100, since the opening portion is formed to surround the corresponding via-plug, it is considered that an end face (an area forming the inclined surface) of each pair layer actually has an annular shape or a shape obtained by removing a part from the annular shape. On the other hand, the area in which the curved surface is formed for each pair layer may be end faces of the pair layers forming the inclined surface of the opening portion, but the curved surface may be formed in a part of the area. When the curved surface is formed on the overall end faces of the pair layers forming the inclined surface of the opening portion, it is possible to further improve adhesiveness to the cover layer and to further prevent separation of the cover layer from the stacked body.

A method of manufacturing the thin-film capacitor 100 will be described below with reference to FIGS. 3A to 3B. The method of manufacturing the thin-film capacitor 100 includes a step of forming a stacked body including an opening portion, a step of forming a cover layer, a baking step, and a step of forming and connecting a terminal electrode.

First, in the step of forming a stacked body, a metal foil which becomes the lower electrode layer 1 is prepared. The metal foil is polished such that the surface thereof has predetermined arithmetic mean roughness Ra if necessary. This polishing can be performed using a method such as chemical mechanical polishing (CMP), electrolytic polishing, or buff polishing. Then, dielectric films 2a, 4a, and 6a which become the dielectric layers and internal electrode films 3a and 5a which become the internal electrode layers are alternately formed on the lower electrode layer 1.

The composition of the dielectric films 2a, 4a, and 6a is selected depending on the dielectric layers 2, 4, and 6 of the completed thin-film capacitor 100. A film forming technique such as a physical vapor deposition (PVD) method such as a solution method or a sputtering method or a chemical vapor deposition (CVD) method can be used as the method of forming the dielectric films 2a, 4a, and 6a, and the sputtering method is more preferable.

The composition of the internal electrode films 3a and 5a is selected depending on the internal electrode layers 3 and 5 of the completed thin-film capacitor 100. A DC sputtering method or the like can be used as the method of forming the internal electrode films 3a and 5a.

Figure 3A:
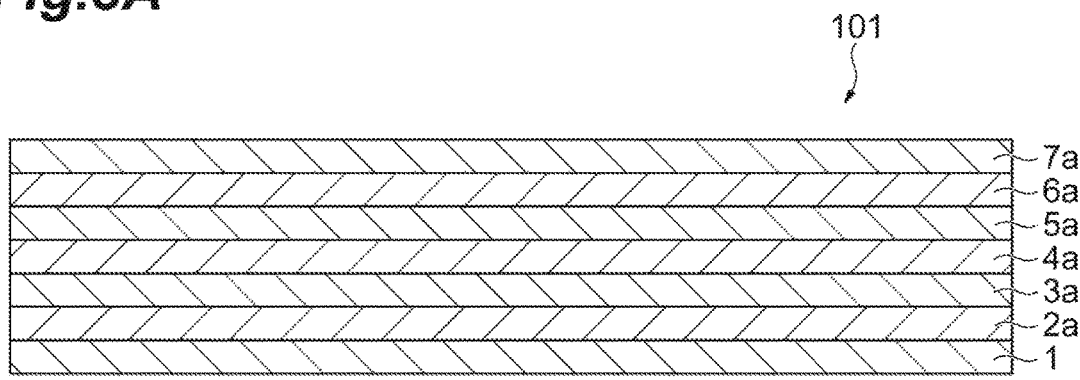
FIGS. 3A to 3C are diagrams illustrating a method of manufacturing the thin-film capacitor.

As illustrated in FIG. 3A, an upper electrode film 7a is formed on the dielectric film 6a out of a Ni alloy after the dielectric films 2a, 4a, and 6a and the internal electrode films 3a and 5a are alternately stacked. Accordingly, a stacked body 101 in which the lower electrode layer 1, the dielectric film 2a, the internal electrode film 3a, the dielectric film 4a, the internal electrode film 5a, the dielectric film 6a, and the upper electrode film 7a are sequentially stacked is obtained. A DC sputtering method or the like can be used as the method of forming the upper electrode film 7a.

Then, opening portions are formed in the stacked body 101. Formation of the opening portions is performed by dry etching for each pair layer including an upper electrode film (the upper electrode film or the internal electrode film) and a dielectric film stacked below the electrode layer. The pair layer corresponds to a pair layer in the thin-film capacitor 100. A resist pattern in which through-holes are formed in predetermined parts is formed on the stacked body 101. Thereafter, etching of an uppermost pair layer is performed using a method such as reactive ion etching (RIE) or ion milling with the resist pattern as an etching pattern. After etching of one pair layer has been completed, the remaining etching pattern is removed.

In order to perform etching such that an end face of the pair layer is concave like the thin-film capacitor 100, etching rates are controlled such that an etching rate of the dielectric film is smaller than an etching rate of the electrode film. The control method is not particularly limited, but, for example, when Ni is used as the material of the metal film and $BaTiO_3$ is used as the material of the dielectric film, the above-mentioned relationship can be realized by appropriately adjusting a type and a mixing ratio of a reactive gas. In addition, a difference in etching rate between the electrode film and the dielectric film can be provided by adjusting a bias voltage, a gas pressure, or a substrate temperature. For example, by setting etching conditions such that the mixing ratio of a halogen reactive gas is small and the bias voltage is high, a preferable structure (an inclination angle and a depth of a concave inclined surface) in the thin-film capacitor 100 according to this embodiment can be realized.

Figure 3B:
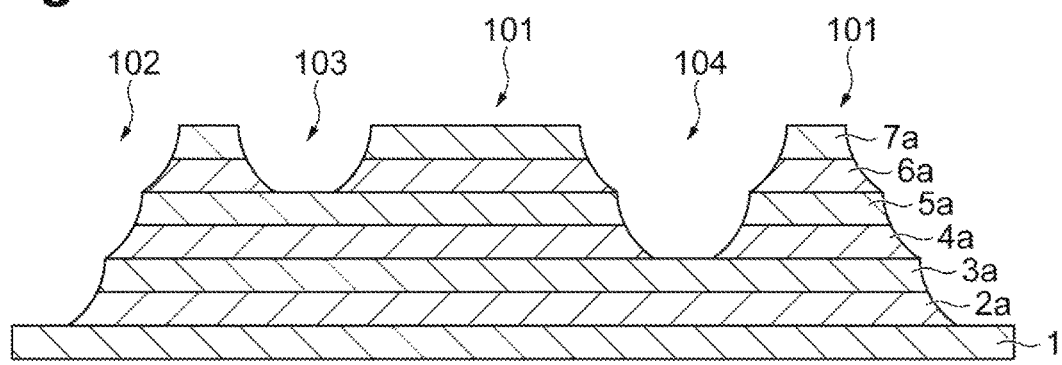

Thereafter, by repeating formation of a resist pattern, etching of one pair layer while performing control of an etching rate, and removal of the resist pattern, opening portions 102 to 104 corresponding to the opening portions 10A to 10C can be formed as illustrated in FIG. 3B. By repeating etching of one pair layer, an inclined surface in which a concave curved surface for each pair layer is repeated can be formed like the opening portions 102 and 104.

Figure 3C:
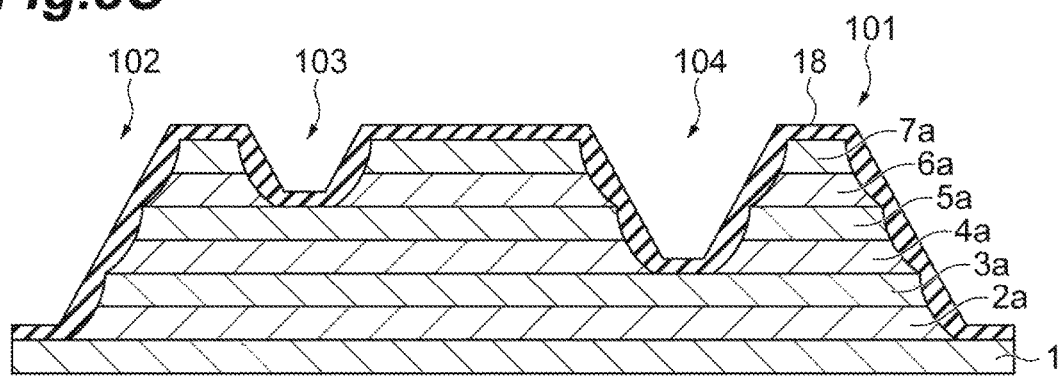

Thereafter, a cover film 18a is formed to cover the surface of the lower electrode film 1a, the dielectric films 2a, 4a, and 6a, the internal electrode films 3a and 5a, and the upper electrode film 7a. A material of the cover film 18a is selected depending on the material of the cover layer 18. As illustrated in FIG. 3C, the surfaces of the opening portions 102 to 104 and the upper electrode film 7a in the stacked body 101 are covered by the cover film 18a.

Thereafter, the stacked body 101 covered with the cover film 18a is baked. The baking temperature is preferably set to a temperature at which the dielectric films 2a, 4a, and 6a are sintered (crystallized) and preferably ranges from 500° C. to 1000° C. The baking time can be set to 5 minutes to two hours. The baking atmosphere is not particularly limited, and may be any one of an oxidizing atmosphere, a reducing atmosphere, and a neutral atmosphere. It is preferable that the backing be performed in at least an oxygen partial pressure in which the electrode films (the lower electrode film 1a, the internal electrode films 3a and 5a, and the upper electrode film 7a) are not oxidized. Accordingly, the dielectric layers 2, 4, and 6 and the cover layer 18 are formed. Formation of an oxide film in an interface between the electrode film and the dielectric film and an interface between the electrode film and the cover film is suppressed by baking the dielectric films after forming the cover film 18a.

Then, a protective layer and a terminal electrode are formed and connected in the backed stacked body. Specifically, the protective layer is stacked on the cover layer 18 of the baked stacked body. Thereafter, the via-plugs 13, 14, 15, and 16 (see FIG. 1) penetrating the protective layer and the cover layer are formed. The terminal electrodes 11 and 12 (see FIG. 1) are formed to be electrically connected to the via-plugs on the protective layer. An annealing process may be performed on the stacked body in which the terminal electrodes have been formed. The annealing process can be performed in the decompressed atmosphere with a temperature of 200° C. to 400° C. The decompressed atmosphere refers to an atmosphere in which the pressure is lower than one atmospheric pressure (=101325 Pa). Electrical characteristics can be stabilized by performing the annealing process. Accordingly, the thin-film capacitor 100 according to this embodiment illustrated in FIG. 1 is obtained.

In this way, in the thin-film capacitor 100 according to this embodiment, a curved surface with a predetermined pattern is formed for each of the pair layers 31, 32, and 33 (see FIGS. 2A) including a dielectric layer and an electrode layer (the internal electrode layer or the upper electrode layer) stacked thereon on the inclined surfaces in the peripheries of the opening portions 10A to 10C of the stacked body 10. Accordingly, on the inclined surfaces of the opening portions, adhesiveness of the cover layer 18 to the stacked body 10 of the electrode layers and the dielectric layers is improved. Accordingly, in the thin-film capacitor 100, since separation of the cover layer 18 from the stacked body 10 is prevented, it is possible to achieve advantageous effects of improvement in yield or prevention of breakage.

In the thin-film capacitor 100, the patterns of the curved surfaces of the pair layers 31, 32, and 33 have a concave shape. When the patterns have a concave shape, the widths (the lengths in a direction parallel to a plane perpendicular to the stacking direction) of the dielectric layers 2, 4, and 6 are all defined as W2, and the widths of the internal electrode layers 3 and 5 and the upper electrode layer 7 are all defined as W3 as illustrated in FIG. 2A, a relationship of W2>W3 is satisfied. That is, on the inclined surface, the ratio of the dielectric layers 2, 4, and 6 to the internal electrode layers 3 and 5 and the upper electrode layer 7 increases. In this configuration, for example, when the cover layer 18 is formed of the same material as the dielectric layers 2, 4, and 6, adhesiveness is further improved. Accordingly, it is possible to further improve adhesiveness of the cover layer 18 to the stacked body 10.

The patterns of the curved surfaces of the pair layers 31, 32, and 33 can be formed in a concave shape by controlling the etching rates at the time of forming the opening portions 102 to 104 in the stacked body 101 before being baked. Accordingly, it is possible to manufacture the thin-film capacitor 100 with improved adhesiveness of the cover layer 18 to the stacked body 10, for example, without increasing new processing work such as surface treatment of the inclined surface.

When a curved surface is formed on the overall end faces of the pair layers forming the inclined surface of the opening portion, it is possible to further improve adhesiveness of the cover layer 18 to the stacked body 10.

Although it has been described in the above-mentioned embodiment that the pattern of the curved surface of each of the pair layers 31, 32, and 33 has a concave shape, the pattern of the curved surface is not limited to the concave shape. As described above in the embodiment, the shape of the curved surface of each pair layer can be appropriately changed as long as a structure capable of improving adhesiveness of the cover layer to the stacked body by an anchor effect of the inclined surface can be obtained.

Figure 4A:
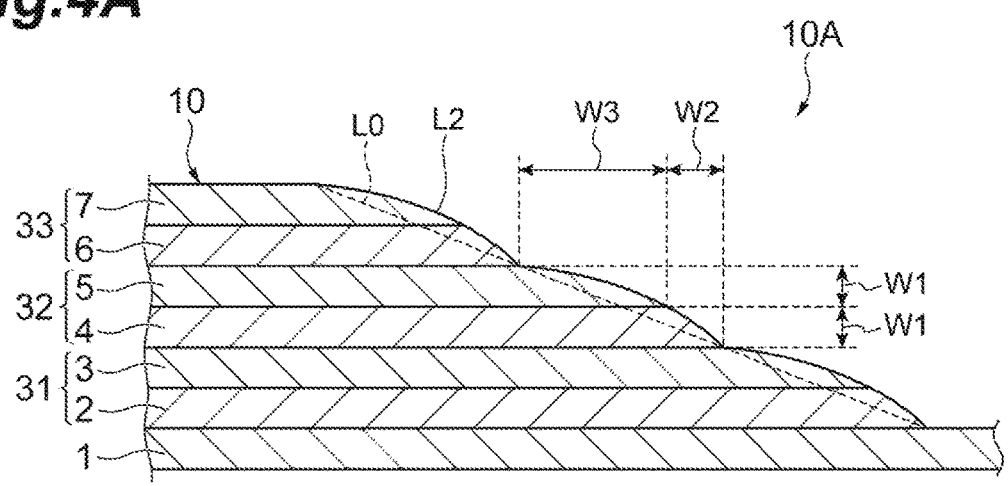
FIGS. 4A and 4B are diagrams illustrating an inclined surface of a thin-film capacitor according to a modified example.
Figure 4B:
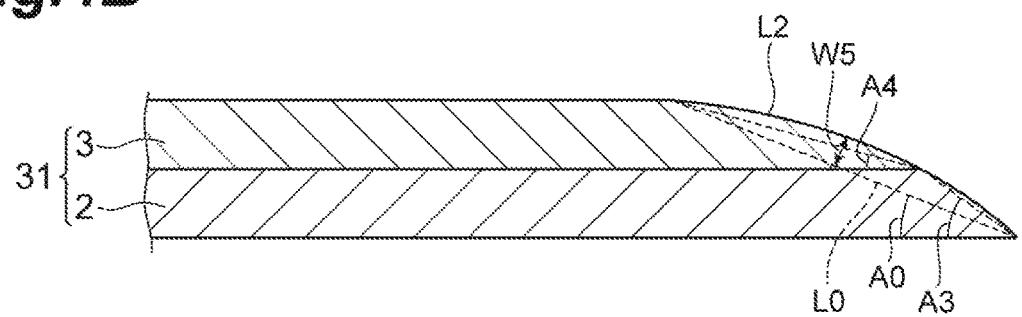

FIGS. 4A and 4B illustrate a modified example in which the curved surface of the inclined surface of the opening portion has a convex shape (a convex shape when viewed in the stacking direction). FIGS. 4A and 4B are diagrams corresponding to FIGS. 2A and 2B. In the example illustrated in FIG. 4A, similarly to FIGS. 2A and 2B, a pair layer 31 is formed by the dielectric layer 2 and the internal electrode layer 3 stacked thereon. A pair layer 32 is formed by the dielectric layer 4 and the internal electrode layer 5 stacked thereon. A pair layer 33 is formed by the dielectric layer 6 and the upper electrode layer 7 stacked thereon. In the modified example illustrated in FIG. 4, the curved surface formed by each of the pair layers 31, 32, and 33 has a convex shape.

As illustrated in FIG. 4A, it is assumed that thicknesses (lengths in the stacking direction) of the dielectric layers 2, 4, and 6, the internal electrode layers 3 and 5, and the upper electrode layer 7 are all defined as W1, widths (the lengths in a direction parallel to a plane perpendicular to the stacking direction) of the dielectric layers 2, 4, and 6 are all defined as W2, and widths of the internal electrode layers 3 and 5 and the upper electrode layer 7 are all defined as W3. When the inclined surface has a convex shape, a relationship of W2<W3 is satisfied as illustrated in FIG. 4A. As illustrated in FIG. 4A, the length L2 of the convex inclined surface is larger than the length of a reference line L0, where a line connecting ends in the stacking direction of the pair layers 31, 32, and 33 is defined as the reference line L0. The reference line L0 also corresponds to a line connecting ends of the inclined surface.

In a case in which the convex inclined surface is formed for each of the pair layers 31, 32, and 33, when an angle of the inclined surface of the lower dielectric layer 2 of the pair layer 31 (an angle formed by a straight line connecting an upper end and a lower end and the horizontal plane) is defined as an inclination angle A3 and an angle of the inclined surface of the upper internal electrode layer 3 is defined as an inclination angle A4 as illustrated in FIG. 4B, a relationship of A3>A4 is satisfied. When an angle formed by the reference line L0 of the inclined surface and the horizontal plane is defined as an inclination angle A0, a relationship of A3>A0>A4 is satisfied. It is preferable that the inclination angle A0 range from 10° to 45°. When the inclination angle A0 is less than 10°, the inclined surface has a slower inclination and thus the opening portion increases in size. Since the increase in size of the opening portion causes a decrease in capacity, the size of the thin-film capacitor 100 is increased to secure a desired capacity. On the other hand, when the inclination angle A0 is greater than 45°, the inclined surface has an acute angle and thus the size of the opening portion can decrease. On the other hand, since the ends of the neighboring electrode layers with one dielectric layer interposed therebetween get close to each other, a likelihood that the electrode layers will short-circuit at the time of processing or the like increases. Accordingly, by setting the inclination angle A0 to the above-mentioned range, it is possible to prevent the electrode layers from short-circuiting while preventing an increase in size of the opening portion.

As illustrated in FIG. 4B, a maximum distance (a depth of the inclined surface) W5 of the surface of the convex inclined surface from the reference line L0 preferably ranges from 10 nm to 500 nm. By setting the maximum distance W5 of the surface of the inclined surface from the reference line L0 to be equal to or greater than 10 nm, an anchor effect due to the curved inclined surface can be suitably achieved. On the other hand, when the maximum distance W5 is set to be greater than 500 nm, the dielectric layer needs to be left more than the electrode layer and thus the size of the thin-film capacitor 100 needs to be increased. That is, in order to prevent an increase in size of the thin-film capacitor 100, it is preferable that the maximum distance W5 be set to be equal to or less than 500 nm.

One method of forming the inclined surface of an opening portion in the thin-film capacitor 100 as a convex curved surface for each pair layer is controlling the etching rate, similarly to the case of the concave shape. In order to perform etching such that the inclined surface of the opening portion in the thin-film capacitor has a convex shape for each pair layer, the etching rate of the dielectric layer is controlled to be greater than the etching rate of the electrode layer. The control method is not particularly limited, and, for example, when Ni is used as the material of the metal layer and $BaTiO_3$ is used as the material of the dielectric layer, the above-mentioned relationship can be realized by appropriately adjusting a type and a mixing ratio of a reactive gas. In addition, a difference in etching rate between the electrode film and the dielectric film can be provided by adjusting a bias voltage, a gas pressure, or a substrate temperature. For example, by setting etching conditions such that the mixing ratio of a halogen reactive gas is large and the bias voltage is low, a preferable structure (an inclination angle and a depth of a convex inclined surface) in the thin-film capacitor 100 according to this embodiment can be realized.

When the inclined surface of each opening portion is formed as a convex curved surface for each pair layer, it is preferable that the etching rate be controlled at the final time of repeating formation of a resist pattern, etching of one pair layer, and removal of the resist pattern several times (the number of times corresponding to the number of stacked pair layers). By controlling the etching rate at least at the final time and performing the etching in a state in which the etching rate for the electrode layer is greater than the etching rate for the dielectric layer, etching of the dielectric layer of each pair layer is promoted even when a plurality of pair layers are stacked, and an inclined surface in which the convex curved surface illustrated in FIGS. 4A and 4B is repeatedly formed in the stacking direction is formed.

Even when the convex curved surface is formed for each pair layer as in the modified example illustrated in FIGS. 4A and 4B, adhesiveness of the cover layer to the stacked body is improved by an anchor effect of the inclined surface similarly to the concave curved surface. When the inclined surface is a convex curved surface, a ratio of the internal electrode layers 3 and 5 to the dielectric layers 2, 4, and 6 and the upper electrode layer 7 on the inclined surface increases. Accordingly, when an inorganic material is used as the material of the cover layer 18, it is considered that adhesiveness is particularly increased. When the inclined surface is a concave curved surface, a ratio of the dielectric layers 2, 4, and 6 to the internal electrode layers 3 and 5 and the upper electrode layer 7 on the inclined surface is increased. Accordingly, when a dielectric material is used as the material of the cover layer 18, it is considered that adhesiveness is particularly increased.

While an embodiment of the invention has been described above, the thin-film capacitor according to the invention is not limited to the embodiment and can be modified in various forms.

For example, in the above-mentioned embodiment, a configuration in which a plurality of dielectric layers 2, 4, and 6 are stacked on the lower electrode layer 1 and the internal electrode layers 3 and 5 are disposed between the dielectric layers 2, 4, and 6 has been described, but the thin-film capacitor may have a configuration in which two dielectric layers are stacked on the lower electrode layer 1 (that is, the number of internal electrode layers is one). The number of dielectric layers may be three or more. The number of internal electrode layers is changed depending on the number of dielectric layers. The number of opening portions is also changed depending on the number of lower electrode layers and internal electrode layers.

The thin-film capacitor may have a configuration in which no internal electrode layer is disposed, that is, a configuration in which one dielectric layer is stacked on the lower electrode layer and the upper electrode layer is stacked thereon. In this case, the upper electrode layer corresponds to an "internal electrode layer" stacked on at least a dielectric layer. Even when the number of dielectric layers is one, the lower electrode layer serves as the bottom surface of the opening portion and a dielectric layer and an electrode layer (the upper electrode layer) thereon as a pair layer exhibit a curved surface with a predetermined curved surface, whereby adhesiveness to the cover layer 18 covering the inclined surface is improved. In this way, the thin-film capacitor according to the invention has only to include one or more dielectric layers which are stacked on the lower electrode layer and one or more internal electrode layers (which may be the upper electrode layer) which are stacked on the dielectric layers.

Arrangement of the terminal electrodes 11 and 12 and arrangement of the via-plugs can be appropriately changed. Arrangement of the opening portions can be appropriately changed depending on the arrangement of the via-plugs. The inclination angle of the inclined surface can be appropriately changed depending on the arrangement of the opening portions.

The method of manufacturing the thin-film capacitor is not limited to the above-mentioned embodiment. In the embodiment, a configuration in which a plurality of dielectric layers 2, 4, and 6 stacked on the lower electrode layer 1 and the cover layer 18 are baked together has been described, but a configuration in which baking is performed several times (for each dielectric layer) or a configuration in which the opening portions are formed after baking may be employed.

The processing method for forming the inclined surface in a curved surface for each pair layer is not limited to control of the etching rate in dry etching as described above. For example, the predetermined shape of each pair layer may differ depending on the pair layers. Specifically, a pair layer having a convex curved surface and a pair layer having a concave curved surface may be mixed. Such an embodiment can be realized by appropriately selecting etching conditions for each pair layer.

What is claimed is:

1. A stacked body for a thin-film capacitor, the stacked body comprising:
   a lower electrode layer;
   one or more dielectric layers that are stacked on the lower electrode layer in a stacking direction;
   one or more internal electrode layers that are stacked on any one of the one or more dielectric layers in the stacking direction;
   an opening portion that has the lower electrode layer or one electrode layer selected from the one or more internal electrode layers as a bottom surface, opens upward in the stacking direction of the electrode layer of the bottom surface, and has a side surface which is formed to include an inclined surface formed by the dielectric layer and the internal electrode layer above the electrode layer of the bottom surface,
   a cover layer that covers the inclined surface; and
   a curved surface with a predetermined shape formed on the inclined surface, the curved surface being formed continuously over the dielectric layer and the adjacent internal electrode layer forming the inclined surface.

2. The stacked body according to claim 1, wherein the predetermined shape is a concave shape or a convex shape.

3. The stacked body according to claim 2, wherein the curved surface with the predetermined shape is formed over an entirety of the inclined surface.

4. The stacked body according to claim 1, wherein the curved surface with the predetermined shape is formed over an entirety of the inclined surface.

5. The stacked body according to claim 1, wherein the dielectric layer forming the inclined surface is below the internal electrode layer forming the inclined surface, an angle of the inclined surface of the dielectric layer forming the inclined surface is defined as an inclination angle $A1$, an angle of the inclined surface of the internal electrode layer forming the inclined surface is defined as an inclination angle $A2$, and an angle formed by reference line $L0$ of the inclined surface and a horizontal plane is defined as an inclination angle $A0$, a relationship of $A1<A0<A2$ is satisfied.

6. The stacked body according to claim 1, wherein thicknesses of the dielectric layers and the electrode layers are equal, widths of the dielectric layers are all defined as $W2$, and widths of the electrode layers are all defined as $W3$, a relationship of $W2>W3$ is satisfied.

* * * * *